(12) United States Patent
Itagaki et al.

(10) Patent No.: US 7,916,522 B2
(45) Date of Patent: Mar. 29, 2011

(54) SEMICONDUCTOR MEMORY DEVICE

(75) Inventors: Kiyotaro Itagaki, Yokohama (JP); Tsuneo Inaba, Kamakura (JP); Yoshihiro Ueda, Yokohama (JP); Yoshiaki Asao, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 94 days.

(21) Appl. No.: 12/400,262

(22) Filed: Mar. 9, 2009

(65) Prior Publication Data

US 2009/0257274 A1   Oct. 15, 2009

(30) Foreign Application Priority Data

Apr. 14, 2008   (JP) .................................. 2008-105081

(51) Int. Cl.
*G11C 11/15* (2006.01)
(52) U.S. Cl. ........................................ 365/158; 365/173
(58) Field of Classification Search .................. 365/158, 365/173

See application file for complete search history.

(56) References Cited

U.S. PATENT DOCUMENTS

| 5,695,864 | A | 12/1997 | Slonczewski |
| 6,944,048 | B2 | 9/2005 | Iwata |
| 2004/0095805 | A1* | 5/2004 | Matsuoka .................. 365/185.2 |
| 2005/0157538 | A1* | 7/2005 | Moriyama et al. ............ 365/158 |
| 2005/0232002 | A1* | 10/2005 | Iwata ............................. 365/158 |

FOREIGN PATENT DOCUMENTS

JP        2003-229547        8/2003

* cited by examiner

*Primary Examiner* — Michael T Tran
(74) *Attorney, Agent, or Firm* — Oblon, Spivak, McClelland, Maier & Neustadt, L.L.P.

(57) ABSTRACT

A semiconductor memory device includes n resistance change elements which are arranged in one cell, have a low-resistance state and a high resistance state, are connected in series or parallel, have different resistance values in the same resistance state, and change between the low-resistance state and the high-resistance state under different conditions, and a write circuit which is connected to one end of the n resistance change elements, and applies a pulse current m ($1 \leq m \leq n$) times to the n resistance change elements during a write operation. Letting Im be a current value of an mth pulse current, condition $I1 > I2 > \ldots > Im$ holds.

14 Claims, 7 Drawing Sheets

Write Operation Example 1

| | MTJ storage bit | | | Write current amount | | |
|---|---|---|---|---|---|---|
| | MTJ1 | MTJ2 | MTJ3 | 1st. | 2nd. | 3rd. |
| (a) | 0 | 0 | 0 | +I3 | | |
| (b) | 0 | 0 | 1 | −I3 | +I2 | |
| (c) | 0 | 1 | 0 | +I3 | −I2 | +I1 |
| (d) | 0 | 1 | 1 | −I3 | +I1 | |
| (e) | 1 | 0 | 0 | +I3 | −I1 | |
| (f) | 1 | 0 | 1 | −I3 | +I2 | −I1 |
| (g) | 1 | 1 | 0 | +I3 | −I2 | |
| (h) | 1 | 1 | 1 | −I3 | | |

$Ic1 < I1 < Ic2 < I2 < Ic3 < I3$
$t0 = t1 = t2 = t3$

Write Operation Example 2

| | MTJ storage bit | | | Application time and direction | | |
|---|---|---|---|---|---|---|
| | MTJ1 | MTJ2 | MTJ3 | 1st. | 2nd. | 3rd. |
| (a) | 0 | 0 | 0 | t3,+ | | |
| (b) | 0 | 0 | 1 | t3,- | t2,+ | |
| (c) | 0 | 1 | 0 | t3,+ | t2,- | t1,+ |
| (d) | 0 | 1 | 1 | t3,- | t1,+ | |
| (e) | 1 | 0 | 0 | t3,+ | t1,- | |
| (f) | 1 | 0 | 1 | t3,- | t2,+ | t1,- |
| (g) | 1 | 1 | 0 | t3,+ | t2,- | |
| (h) | 1 | 1 | 1 | t3,- | | |

$tc1 < t1 < tc2 < t2 < tc3 < t3$

F I G. 5

SEMICONDUCTOR MEMORY DEVICE

CROSS-REFERENCE TO RELATED APPLICATIONS

This application is based upon and claims the benefit of priority from prior Japanese Patent Application No. 2008-105081, filed Apr. 14, 2008, the entire contents of which are incorporated herein by reference.

BACKGROUND OF THE INVENTION

1. Field of the Invention

The present invention relates to a semiconductor memory device and, more particularly, to a spin transfer torque writing type magnetic random access memory (MRAM).

2. Description of the Related Art

The MRAM is a device that stores information by using the magnetoresistive effect, and expected as a nonvolatile RAM capable of replacing a DRAM, EEPROM, and the like because the MRAM has volatility, a high operating speed, a high integration degree, and high reliability. In particular, a spin transfer torque writing type MRAM using magnetization reversal caused by polarized spin electric current transfer is attracting attention in recent years (e.g., U.S. Pat. No. 5,695,864).

To extend the market, it is important to reduce the chip fabrication cost. For this purpose, the cell area per bit must be decreased. An area of $8F^2$ is proposed as a minimum cell area of the spin transfer torque writing type MRAM. Since, however, this cell area is equal to that of a general DRAM, a smaller cell area is necessary.

As disclosed in, e.g., Jpn. Pat. Appln. KOKAI Publication No. 2003-229547, a method of decreasing the cell area of an induced magnetic field writing type MRAM by stacking an MTJ (Magnetic Tunnel Junction) element on a substrate is proposed. A read method of Jpn. Pat. Appln. KOKAI Publication No. 2003-229547 can also be used for the spin transfer torque writing type MRAM.

Unfortunately, in the spin transfer torque writing method, electric currents must be supplied in two directions, i.e., from one terminal to the other of the MTJ element and vice versa, unlike in the magnetic field writing method. Accordingly, the arrangement of the magnetic field writing method cannot be used for the spin transfer torque writing method, so a new configuration is required.

BRIEF SUMMARY OF THE INVENTION

A semiconductor memory device according to the first aspect of the present invention comprising n resistance change elements which are arranged in one cell, have a low-resistance state and a high resistance state, are connected in series or parallel, have different resistance values in the same resistance state, and change between the low-resistance state and the high-resistance state under different conditions; and a write circuit which is connected to one end of the n resistance change elements, and applies a pulse current m ($1 \leq m \leq n$) times to the n resistance change elements during a write operation, wherein letting Im be a current value of an mth pulse current, condition I1>I2> . . . >Im holds.

A semiconductor memory device according to the second aspect of the present invention comprising n resistance change elements which are arranged in one cell, have a low-resistance state and a high resistance state, are connected in series or parallel, have different resistance values in the same resistance state, and changes between the low-resistance state and the high-resistance state under different conditions; and a write circuit which is connected to one end of the n resistance change elements, and applies a pulse current m ($1 \leq m \leq n$) times to the n resistance change elements during a write operation, wherein letting tm be a pulse width of an mth pulse current, condition t1>t2> . . . >tm holds.

BRIEF DESCRIPTION OF THE SEVERAL VIEWS OF THE DRAWING

FIG. 5 is a view for explaining an outline of write operation example 2 according to the embodiment of the present invention;

DETAILED DESCRIPTION OF THE INVENTION

Figure 1:
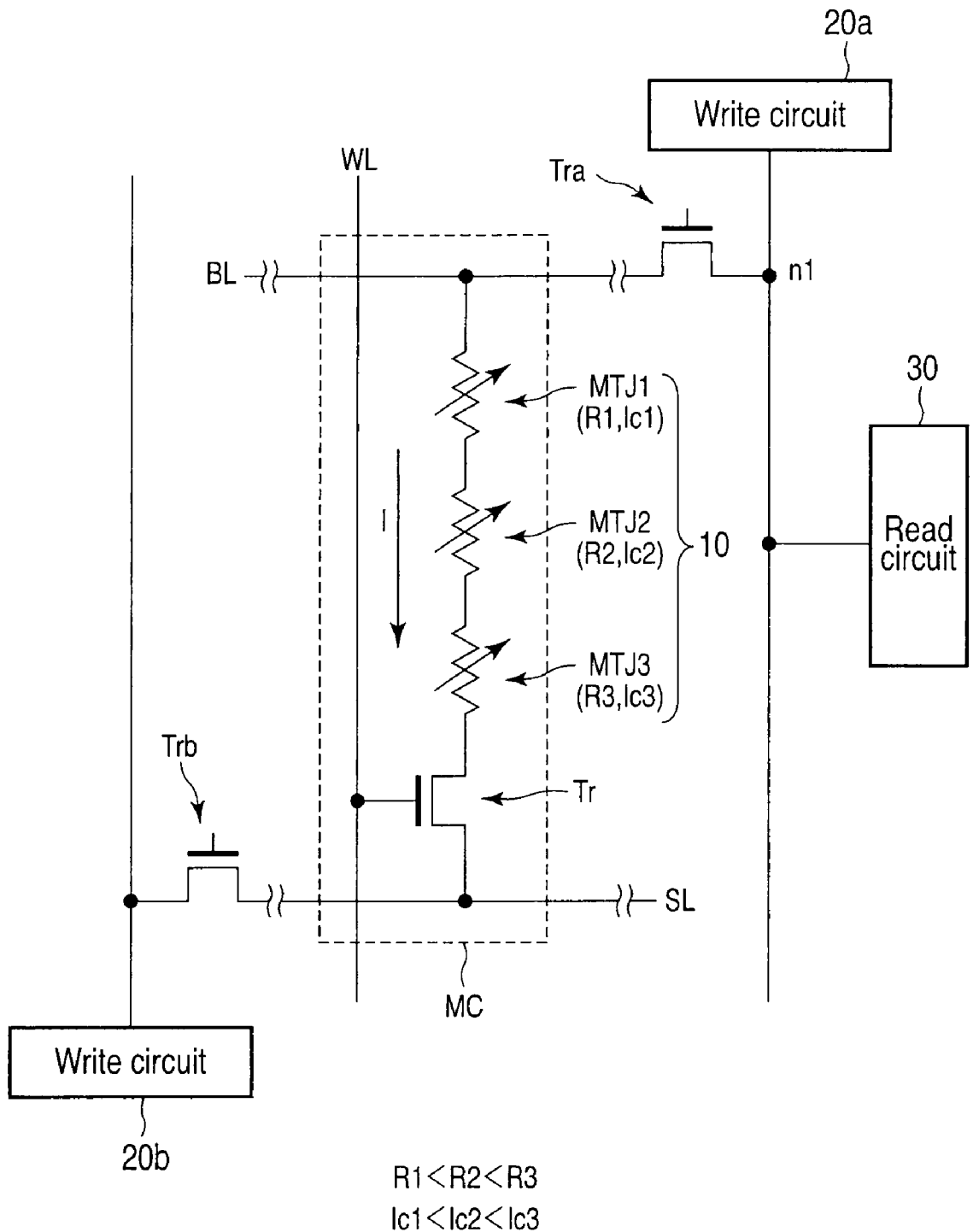
FIG. 1 is an equivalent circuit diagram of the main components of a magnetic random access memory according to an embodiment of the present invention.

An embodiment of the present invention will be explained below with reference to the accompanying drawing. In the following explanation, the same reference numerals denote the same parts throughout the drawing.

[1] Outline

FIG. 1 is an equivalent circuit diagram of the main parts of a magnetic random access memory according to an embodiment of the present invention. An outline of the major components of the magnetic random access memory according to this embodiment will be explained below.

The spin transfer torque writing type magnetic random access memory of this embodiment stores information having a plurality of bits in one memory cell. In a memory cell equivalent circuit, therefore, a plurality of MTJ elements connected in series or parallel are connected in series with one switching element.

In this example, as shown in FIG. 1, a memory cell MC has a transistor Tr and three MTJ elements MTJ1, MTJ2, and MTJ3. Note that the number of MTJ elements in one cell is not limited to three but need only be a plural number. The three MTJ elements MTJ1, MTJ2, and MTJ3 are connected in series to form a memory element group 10. A bit line BL is connected to one end of the memory element group 10, and a write circuit 20a is connected to the bit line BL via a transistor Tra. One end of the current path of the transistor Tr is connected to the other end of the memory element group 10, and a source line SL is connected to the other end of the current path of the transistor Tr. A write circuit 20b is connected to the source line SL via a transistor Trb. A read circuit 30 is connected to a connection node n1 between the write circuit 20a and transistor Tra.

Resistance values R1, R2, and R3 in the same resistance state (a low-resistance state or high-resistance state) and reversal threshold current values Ic1, Ic2, and Ic3 at a pulse width t0 of the MTJ elements MTJ1, MTJ2, and MTJ3 satisfy relations (1) and (2) below.

$$R1<R2<R3 \quad (1)$$

$$Ic1<Ic2<Ic3 \quad (2)$$

In this embodiment, different pieces of information are written in n series-connected MTJ elements. Therefore, the n MTJ elements are individually formed to meet relations (1) and (2) described above, and a write circuit is configured to be able to control a write current amount I or write pulse application time t in m ($1 \leq m \leq n$) stages. Details of the write operation and write circuit will be described later.

Note that the layout in which the MTJ elements MTJ1, MTJ2, and MTJ3 meeting relations (1) and (2) are connected in series is not limited to the layout shown in FIG. 1 in which these MTJ elements are arranged in descending order of resistance such that an MTJ element having the highest resistance in the same resistance state is positioned closest to the transistor Tr. That is, the order of the MTJ elements arranged from the position closest to the transistor Tr can be variously changed to, e.g., "MTJ1, MTJ2, and MTJ3", "MTJ1, MTJ3, and MTJ2", "MTJ2, MTJ1, and MTJ3", "MTJ2, MTJ3, and MTJ1", or "MTJ3, MTJ1, and MTJ2".

[2] Write

[2-1] Write Circuit

Figures 2, 3:
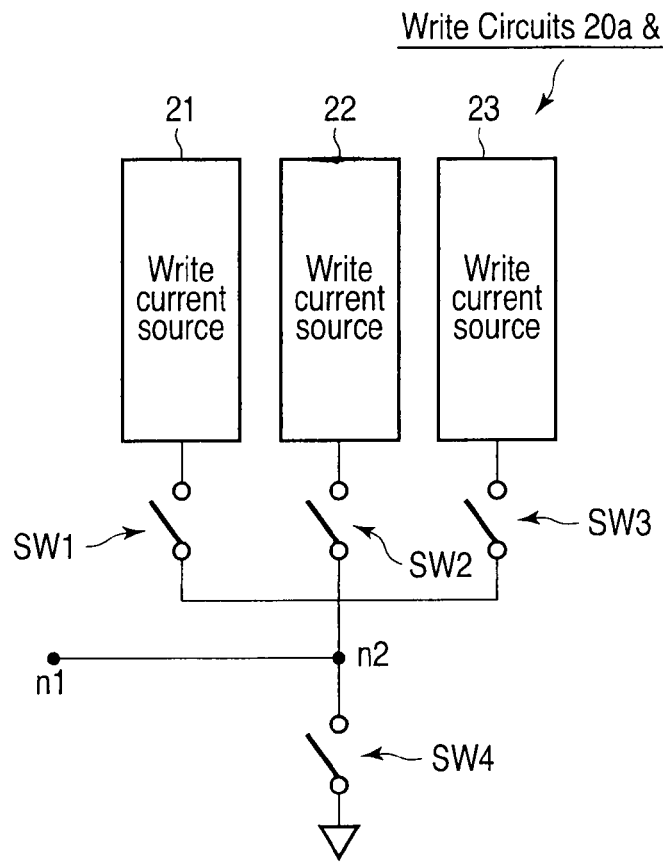
FIG. 2 is a circuit diagram of a write circuit according to the embodiment of the present invention.
FIG. 3 is a view for explaining an outline of write operation example 1 according to the embodiment of the present invention.

FIG. 2 is a circuit diagram of the write circuit according to the embodiment of the present invention. The write circuit according to this embodiment will be explained below.

As shown in FIG. 2, the write circuits 20a and 20b of this embodiment each include three write current sources 21, 22, and 23, and four switches SW1, SW2, SW3, and SW4. The write current sources 21, 22, and 23 and switches SW1, SW2, and SW3 may be equal in number to or different in number from the MTJ elements in the memory element group 10.

The switches SW1, SW2, and SW3 are respectively connected to the write current sources 21, 22, and 23. A connection node n2 of the switches SW1, SW2, and SW3 is connected to the switch SW4, and also connected to the connection node n1 between the write circuit 20a and transistor Tra shown in FIG. 1.

[2-2] Write Operation Example 1

Write operation example 1 according to this embodiment will be explained below with reference to FIGS. 3 and 4.

In write operation example 1, current amounts I1, I2, and I3 and pulse widths t1, t2, and t3 that can be supplied to the write current paths when the write current sources 21, 22, and 23 of the write circuits 20a and 20b shown in FIG. 2 are turned on are as follows.

First, the write current amounts I1, I2, and I3 respectively supplied by the write current sources 21, 22, and 23 satisfy condition I1<I2<I3. The current amount I1 is larger than the reversal threshold current value Ic1 of the MTJ element MTJ1, and smaller than the reversal threshold current value Ic2 of the MTJ element MTJ2. The current amount I2 is larger than the reversal threshold current value Ic2 of the MTJ element MTJ2, and smaller than the reversal threshold current value Ic3 of the MTJ element MTJ3. The current amount I3 is larger than the reversal threshold current value Ic3 of the MTJ element MTJ3. Furthermore, each of the pulse widths t1, t2, and t3 of the write currents supplied by the write current sources 21, 22, and 23 is equal to t0.

Under the conditions as described above, the write current sources 21, 22, and 23 in write operation example 1 are designed so as to meet relations (3) and (4) below.

$$Ic1<I1<Ic2<I2<Ic3<I3 \quad (3)$$

$$t0=t1=t2=t3 \quad (4)$$

In write operation example 1 as described above, different pieces of information can be written in the series-connected MTJ elements MTJ1, MTJ2, and MTJ3 by using the following method. In the following explanation, the positive direction of the write current is defined as the direction of an arrow shown in FIG. 1.

Figure 4A:
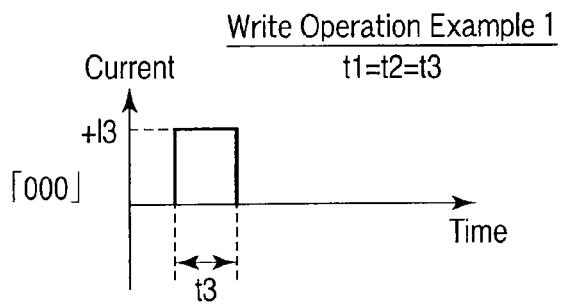
FIGS. 4A to 4H are sequence diagrams of write operation example 1 according to the embodiment of the present invention.

First, assume that 0 is to be written in all the MTJ elements MTJ1, MTJ2, and MTJ3 as shown in a row a of FIG. 3. In this case, as shown in FIG. 4A, the write current source 23 of the write circuit 20a is turned on to supply a write current +I3 with the pulse width t3 (t3=t0) in the positive direction. As a consequence, 0 can be written in all the MTJ elements MTJ1, MTJ2, and MTJ3.

Figure 4E:
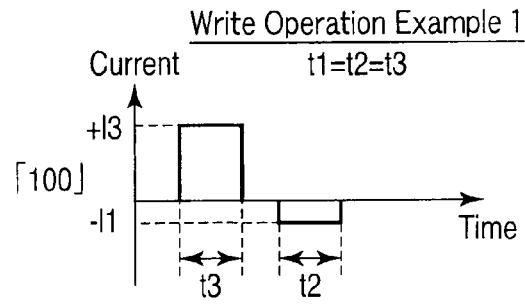
Figure 4B:
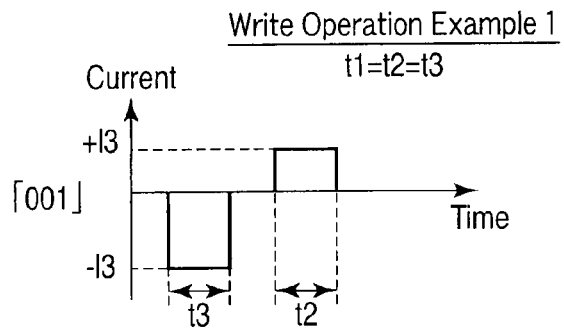

Then, assume that "001" is to be written in the MTJ elements MTJ1, MTJ2, and MTJ3 as shown in a row b of FIG. 3. In this case, as shown in FIG. 4B, the write currents are supplied in the order of −I3 and +I2 with the pulse widths t3 and t2 (t3=t2=t0). Consequently, "001" can be written in the MTJ elements MTJ1, MTJ2, and MTJ3.

Figure 4F:
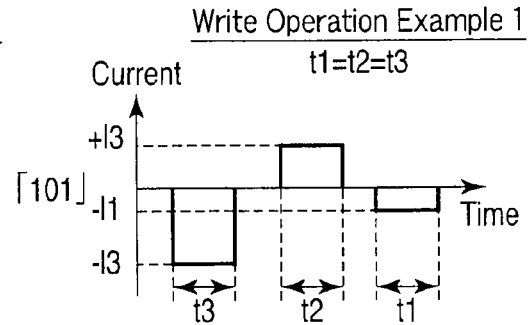
Figure 4C:
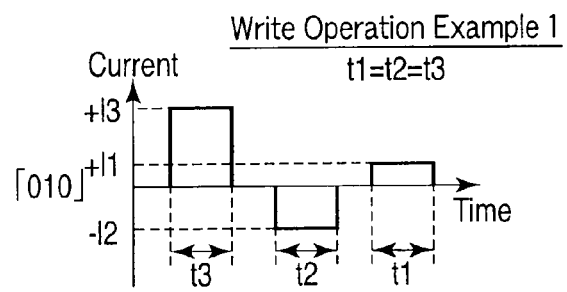

Assume that "010" is to be written in the MTJ elements MTJ1, MTJ2, and MTJ3 as shown in a row c of FIG. 3. In this case, as shown in FIG. 4C, the write currents are supplied in the order of +I3, −I2, and +I1 with the pulse widths t3, t2, and t1 (t3=t2=t1=t0). As a result, "010" can be written in the MTJ elements MTJ1, MTJ2, and MTJ3.

Figure 4G:
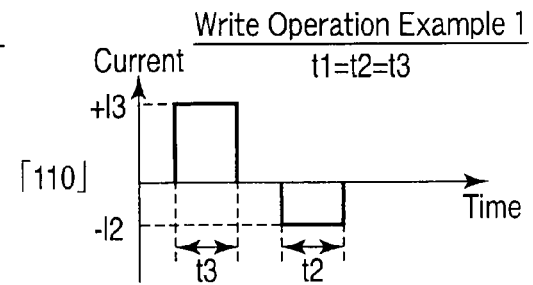
Figure 4D:
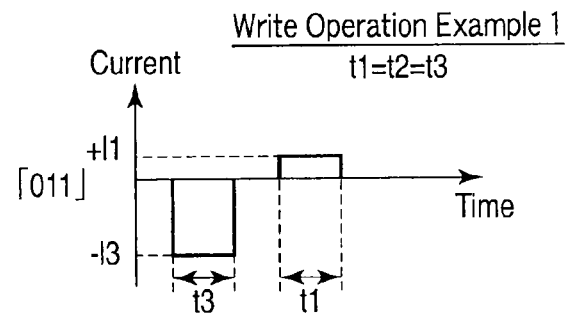

Assume that "011" is to be written in the MTJ elements MTJ1, MTJ2, and MTJ3 as shown in a row d of FIG. 3. In this case, as shown in FIG. 4D, the write currents are supplied in the order of −I3 and +I1 with the pulse widths t3 and t1 (t3=t1=t0). Consequently, "011" can be written in the MTJ elements MTJ1, MTJ2, and MTJ3.

Assume that "100" is to be written in the MTJ elements MTJ1, MTJ2, and MTJ3 as shown in a row e of FIG. 3. In this case, as shown in FIG. 4E, the write currents are supplied in the order of +I3 and −I2 with the pulse widths t3 and t2 (t3=t2=t0). As a consequence, "100" can be written in the MTJ elements MTJ1, MTJ2, and MTJ3.

Assume that "101" is to be written in the MTJ elements MTJ1, MTJ2, and MTJ3 as shown in a row f of FIG. 3. In this case, as shown in FIG. 4F, the write currents are supplied in the order of −I3, +I2, and −I1 with the pulse widths t3, t2, and t1 (t3=t2=t1=t0). As a result, "101" can be written in the MTJ elements MTJ1, MTJ2, and MTJ3.

Subsequently, assume that "110" is to be written in the MTJ elements MTJ1, MTJ2, and MTJ3 as shown in a row g of FIG. 3. In this case, as shown in FIG. 4G, the write currents are supplied in the order of +I3 and −I2 with the pulse widths t3 and t2 (t3=t2=t0). As a result, "110" can be written in the MTJ elements MTJ1, MTJ2, and MTJ3.

Figure 4H:
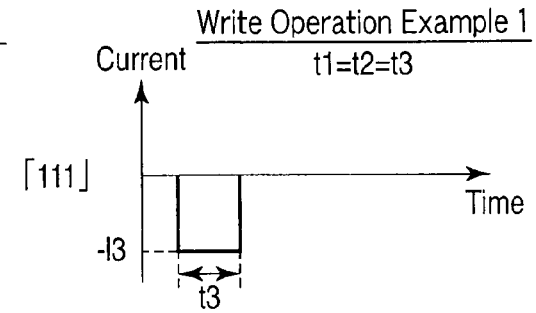

Finally, assume that "111" is to be written in the MTJ elements MTJ1, MTJ2, and MTJ3 as shown in a row h of FIG. 3. In this case, as shown in FIG. 4H, the write current source 23 of the write current circuit 20a is turned on to supply the write current −I3 with the pulse width t3 (t3=t0) in the negative direction. Consequently, 1 can be written in all the MTJ elements MTJ1, MTJ2, and MTJ3.

In write operation example 1 as described above, when the n MTJ elements exist in one cell, the number of times of application of the pulse current to each MTJ element changes in accordance with the write state. Letting m ($1 \leq m \leq n$) be the number of times of application of the pulse current and Im be the mth current value of the pulse current, condition I1>I2> . . . >Im is met. Also, different data can be written in the n MTJ elements by writing the data in order from an MTJ element requiring the largest reversal current amount.

[2-3] Write Operation Example 2

In write operation example 1, different data are written by changing the write current amount while the write pulse time is held constant at t0. In write operation example 2, however, different data are written by changing the write pulse time while the write current amount is held constant.

Write operation example 2 according to this example will be explained below with reference to FIGS. 5 and 6.

In write operation example 2, times tc1, tc2, and tc3 respectively required to reverse the MTJ elements MTJ1, MTJ2, and MTJ3 satisfy tc1<tc2<tc3 while the write current amount is held constant at I4 (see e.g., 2005 IEDM Technical Digest, pp. 459-462, December 2005). When the write current sources 21, 22, and 23 of the write circuits 20*a* and 20*b* shown in FIG. 2 are turned on, the current amounts I1, I2, and I3 and pulse widths t1, t2, and t3 that can be supplied to the write current paths are as follows.

First, each of the write current amounts I1, I2, and I3 supplied by the write current sources 21, 22, and 23 is held equal to I4. The pulse width t1 is larger than the necessary reversal time tc1 of the MTJ element MTJ1, and smaller than the necessary reversal time tc2 of the MTJ element MTJ2. The pulse width t2 is larger than the necessary reversal time tc2 of the MTJ element MTJ2, and smaller than the necessary reversal time tc3 of the MTJ element MTJ3. The pulse width t3 is larger than the necessary reversal time tc3 of the MTJ element MTJ3.

Under the conditions as described above, the write currents 21, 22, and 23 according to write operation example 2 are designed to meet relations (5) and (6) below.

$$I4=I1=I2=I3 \tag{5}$$

$$tc1<t1<tc2<t2<tc3<t3 \tag{6}$$

In write operation example 2 as described above, different pieces of information can be written in the series-connected MTJ elements MTJ1, MTJ2, and MTJ3 by using the following method. In the following explanation, the positive direction of the write current is defined as the direction of the arrow shown in FIG. 1.

Figure 6A:
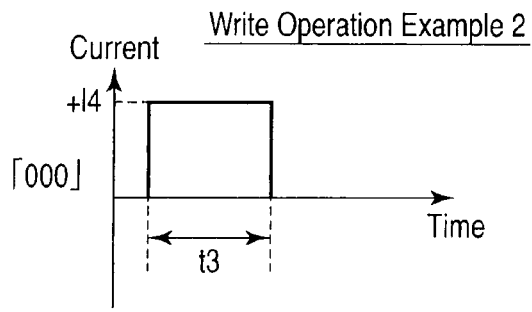
FIGS. 6A to 6H are sequence diagrams of write operation example 2 according to the embodiment of the present invention.

First, assume that 0 is to be written in all the MTJ elements MTJ1, MTJ2, and MTJ3 as shown in a row a of FIG. 5. In this case, as shown in FIG. 6A, the write current source 23 of the write circuit 20*a* is turned on to supply the write current in the positive direction for t3. Consequently, 0 can be written in all the MTJ elements MTJ1, MTJ2, and MTJ3.

Figure 6E:
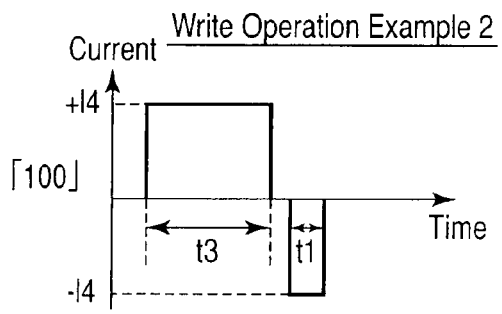
Figure 6B:
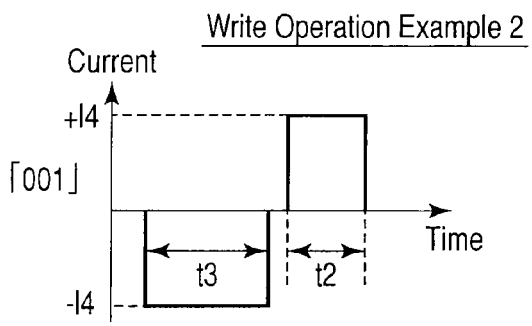

Then, assume that "001" is to be written in the MTJ elements MTJ1, MTJ2, and MTJ3 as shown in a row b of FIG. 5. In this case, as shown in FIG. 6B, the write current is supplied in the negative direction for t2, and then supplied in the positive direction for t2. As a consequence, "001" can be written in the MTJ elements MTJ1, MTJ2, and MTJ3.

Figure 6F:
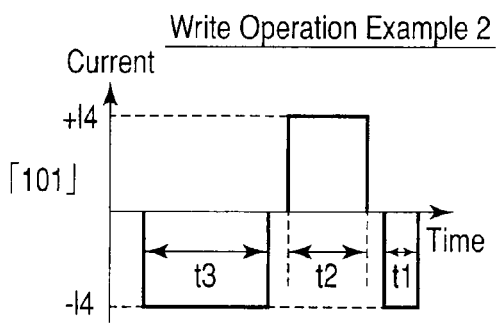
Figure 6C:
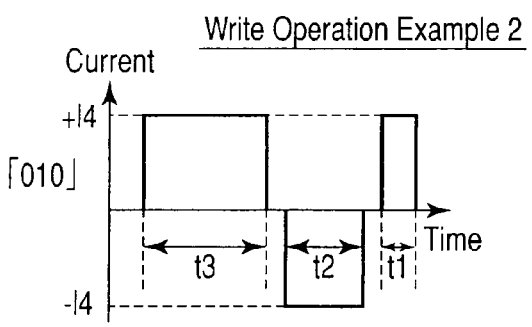

Assume that "010" is to be written in the MTJ elements MTJ1, MTJ2, and MTJ3 as shown in a row c of FIG. 5. In this case, as shown in FIG. 6C, the write current is supplied in the positive direction for t3, then supplied in the negative direction for t2, and finally supplied in the positive direction for t1. As a result, "010" can be written in the MTJ elements MTJ1, MTJ2, and MTJ3.

Figure 6G:
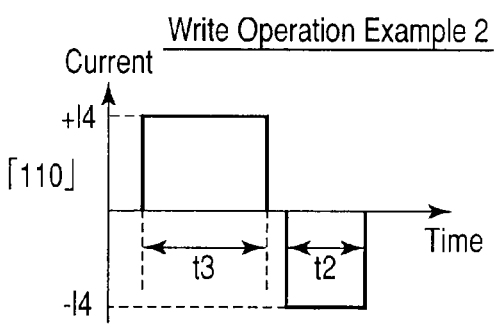
Figure 6D:
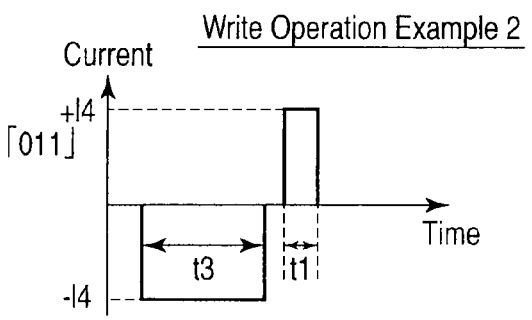

Assume that "011" is to be written in the MTJ elements MTJ1, MTJ2, and MTJ3 as shown in a row d of FIG. 5. In this case, as shown in FIG. 6D, the write current is supplied in the negative direction for t3, and then supplied in the positive direction for t1. As a consequence, "011" can be written in the MTJ elements MTJ1, MTJ2, and MTJ3.

Assume that "100" is to be written in the MTJ elements MTJ1, MTJ2, and MTJ3 as shown in a row e of FIG. 5. In this case, as shown in FIG. 6E, the write current is supplied in the positive direction for t3, and then supplied in the negative direction for t1. Consequently, "100" can be written in the MTJ elements MTJ1, MTJ2, and MTJ3.

Assume that "101" is to be written in the MTJ elements MTJ1, MTJ2, and MTJ3 as shown in a row f of FIG. 5. In this case, as shown in FIG. 6F, the write current is supplied in the negative direction for t3, then supplied in the positive direction for t2, and finally supplied in the negative direction for t1. As a consequence, "101" can be written in the MTJ elements MTJ1, MTJ2, and MTJ3.

Assume that "110" is to be written in the MTJ elements MTJ1, MTJ2, and MTJ3 as shown in a row g of FIG. 5. In this case, as shown in FIG. 6G, the write current is supplied in the positive direction for t3, and then supplied in the negative direction for t2. As a result, "110" can be written in the MTJ elements MTJ1, MTJ2, and MTJ3.

Figure 6H:
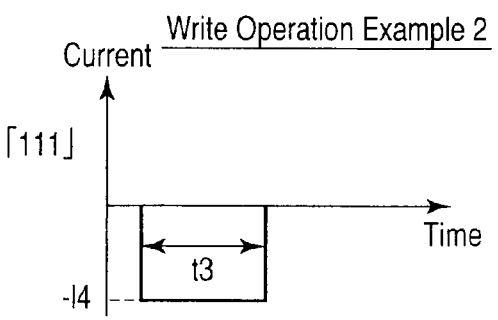

Finally, assume that 1 is to be written in all the MTJ elements MTJ1, MTJ2, and MTJ3 as shown in a row h of FIG. 5. In this case, as shown in FIG. 6H, the write current source 23 of the write circuit 20*a* is turned on to supply the write current in the negative direction for t3. Consequently, 1 can be written in all the MTJ elements MTJ1, MTJ2, and MTJ3.

In write operation example 2 as described above, when n MTJ elements exist in one cell, the number of times of application of a pulse current to each MTJ element changes in accordance with the state to be written. Letting m ($1 \leq m \leq n$) be the number of times of application of the pulse current and tm be the mth pulse width of the pulse current, condition t1>t2> . . . >tm is met. Also, different data can be written in the n MTJ elements by writing the data in order from an MTJ element requiring the largest pulse width.

[3] Read

A read operation principle according to the embodiment of the present invention is as follows. First, when performing a read operation for every block (every memory cell), a plurality of MTJ elements connected in series or parallel in the block have different resistance values in the same magnetization configuration (parallel or antiparallel) during the read operation. By using this difference between the resistance values, data of all the MTJ elements in the block can be read out at once by one read operation.

[3-1] Read Operation Example 1

Read operation example 1 according to the embodiment of the present invention will be explained below.

This example is premised on the assumption that one block (read block) includes four series-connected MTJ elements MTJ1, MTJ2, MTJ3, and MTJ4.

Note that the positions of the MTJ elements MTJ1, MTJ2, MTJ3, and MTJ4 in the block are not particularly limited, and can be freely determined at the time of designing. After the memory device is completed, however, the memory itself must, of course, grasp the positions of the MTJ elements MTJ1, MTJ2, MTJ3, and MTJ4 in the block. This is so because if the memory does not grasp the positions of the MTJ elements MTJ1, MTJ2, MTJ3, and MTJ4, it is impossible to specify a write object among the MTJ elements MTJ1, MTJ2, MTJ3, and MTJ4 during a write operation.

Note also that the resistance values of the four MTJ elements MTJ1, MTJ2, MTJ3, and MTJ4 in a read block during a read operation (when a read current flows) are set as shown in Table 1 below.

TABLE 1

Resistance values of MTJ elements in one block during read operation

| Storage data | MTJ element | | | |
|---|---|---|---|---|
| | MTJ1 | MTJ2 | MTJ3 | MTJ4 |
| "1" (parallel) | R | 2R | 4R | 8R |
| "0" (antiparallel) | R + ΔR | 2R + 2ΔR | 4R + 4ΔR | 8R + 8ΔR |

That is, the MTJ element MTJ1 has a resistance value of R in a parallel magnetization configuration (state "1"), and a resistance value of R+ΔR in an antiparallel magnetization configuration (state "0").

The MTJ element MTJ2 has a resistance value of 2R in the parallel magnetization configuration (state "1"), and a resistance value of 2R+2ΔR in the antiparallel magnetization configuration (state "0").

The MTJ element MTJ3 has a resistance value of 4R in the parallel magnetization configuration (state "1"), and a resistance value of 4R+4ΔR in the antiparallel magnetization configuration (state "0").

The MTJ element MTJ4 has a resistance value of 8R in the parallel magnetization configuration (state "1"), and a resistance value of 8R+8ΔR in the antiparallel magnetization configuration (state "0").

The relationships between the data and synthetic resistance values of the MTJ elements in one block are as shown in Table 2 below.

TABLE 2

Relationships between data and synthetic resistance values of MTJ elements in one block

| | MTJ1 | MTJ2 | MTJ3 | MTJ4 | Synthetic resistance value Radd |
|---|---|---|---|---|---|
| | 1 | 1 | 1 | 1 | 15R |
| | 0 | 1 | 1 | 1 | 15R + ΔR |
| C1 → | | | | | |
| | 1 | 0 | 1 | 1 | 15R + 2ΔR |
| | 0 | 0 | 1 | 1 | 15R + 3ΔR |
| B1 → | | | | | |
| | 1 | 1 | 0 | 1 | 15R + 4ΔR |
| | 0 | 1 | 0 | 1 | 15R + 5ΔR |
| C2 → | | | | | |
| | 1 | 0 | 0 | 1 | 15R + 6ΔR |
| | 0 | 0 | 0 | 1 | 15R + 7ΔR |
| A → | | | | | |
| | 1 | 1 | 1 | 0 | 15R + 8ΔR |
| | 0 | 1 | 1 | 0 | 15R + 9ΔR |
| C3 → | | | | | |
| | 1 | 0 | 1 | 0 | 15R + 10ΔR |
| | 0 | 0 | 1 | 0 | 15R + 11ΔR |
| B2 → | | | | | |
| | 1 | 1 | 0 | 0 | 15R + 12ΔR |
| | 0 | 1 | 0 | 0 | 15R + 13ΔR |

TABLE 2-continued

Relationships between data and synthetic resistance values of MTJ elements in one block

| | MTJ1 | MTJ2 | MTJ3 | MTJ4 | Synthetic resistance value Radd |
|---|---|---|---|---|---|
| C4 → | | | | | |
| | 1 | 0 | 0 | 0 | 15R + 14ΔR |
| | 0 | 0 | 0 | 0 | 15R + 15ΔR |

That is, the data values of the four MTJ elements MTJ1, MTJ2, MTJ3, and MTJ4 in one block have 16 combinations, and the synthetic resistance values also have 16 combinations in accordance with the 16 combinations of the data values. The synthetic resistance values have a minimum value of 15R, and a maximum value of 15R+15ΔR. The difference between the synthetic resistance values is ΔR.

When a read current (current value I) is supplied to the four MTJ elements MTJ1, MTJ2, MTJ3, and MTJ4 in one block during the read operation, the potential of a read bit line BLj takes a value corresponding to the synthetic resistance value of the four MTJ elements MTJ1, MTJ2, MTJ3, and MTJ4 in one block.

Letting I be the current value of the read current, the potential appearing on the read bit line BLj has a minimum value of I×(15R+r), and a maximum value of I×(15R+15ΔR+r). Also, the difference between the potentials appearing on the read bit line BLj is I×ΔR.

In the above case, r is the ON resistance of a read selection switch (MOS transistor) SWA. The ON resistance r is negligible if it is designed to be much lower than the synthetic resistance value of the MTJ elements MTJ1, MTJ2, MTJ3, and MTJ4.

In the read operation principle according to the embodiment of the present invention, when the read current is supplied to a plurality of MTJ elements in a read block during the read operation, a read potential Vtotal corresponding to the combination of the data values of the plurality of MTJ elements appears on the read bit line BLj. By sensing the read potential Vtotal by a sense amplifier (e.g., an analog-to-digital converter), therefore, the data of the plurality of MTJ elements in the read block can be read out at once by one read operation.

Tables 3 and 4 below indicate the principle of determining the data values of the four MTJ elements MTJ1, MTJ2, MTJ3, and MTJ4 in the read block from the synthetic resistance values of the MTJ elements MTJ1, MTJ2, MTJ3, and MTJ4, i.e., from the read potential Vtotal appearing on the read bit line BLj.

TABLE 3

Data determination criterion 1 for MTJ elements in one block

| | "1" (parallel) | "0" (antiparallel) |
|---|---|---|
| MTJ4 | [1] Radd < $15R + 7\Delta R + \frac{\Delta R}{2}$ | [2] Radd > $15R + 7\Delta R + \frac{\Delta R}{2}$ |
| MTJ3 | In case of [1] | In case of [1] |
| | [3] Radd < $15R + 3\Delta R + \frac{\Delta R}{2}$ | [4] Radd > $15R + 3\Delta R + \frac{\Delta R}{2}$ |
| | In case of [2] | In case of [2] |

TABLE 3-continued

Data determination criterion 1 for MTJ elements in one block

| | "1" (parallel) | "0" (antiparallel) |
|---|---|---|
| | [5] $Radd < 15R + 11\Delta R + \frac{\Delta R}{2}$ | [6] $Radd > 15R + 11\Delta R + \frac{\Delta R}{2}$ |
| MTJ2 | In case of [3] | In case of [3] |
| | [7] $Radd < 15R + \Delta R + \frac{\Delta R}{2}$ | [8] $Radd > 15R + \Delta R + \frac{\Delta R}{2}$ |
| | In case of [4] | In case of [4] |
| | [9] $Radd < 15R + 5\Delta R + \frac{\Delta R}{2}$ | [10] $Radd > 15R + 5\Delta R + \frac{\Delta R}{2}$ |
| | In case of [5] | In case of [5] |
| | [11] $Radd < 15R + 9\Delta R + \frac{\Delta R}{2}$ | [12] $Radd > 15R + 9\Delta R + \frac{\Delta R}{2}$ |
| | In case of [6] | In case of [6] |
| | [13] $Radd < 15R + 13\Delta R + \frac{\Delta R}{2}$ | [14] $Radd > 15R + 13\Delta R + \frac{\Delta R}{2}$ |

TABLE 4

Data determination criterion 2 for MTJ elements in one block

| | "1" (parallel) | "0" (antiparallel) |
|---|---|---|
| MTJ1 | In case of [7] | In case of [7] |
| | $Radd < 15R + \frac{\Delta R}{2}$ | $Radd > 15R + \frac{\Delta R}{2}$ |
| | In case of [8] | In case of [8] |
| | $Radd < 15R + 2\Delta R + \frac{\Delta R}{2}$ | $Radd > 15R + 2\Delta R + \frac{\Delta R}{2}$ |
| | In case of [9] | In case of [9] |
| | $Radd < 15R + 4\Delta R + \frac{\Delta R}{2}$ | $Radd > 15R + 4\Delta R + \frac{\Delta R}{2}$ |
| | In case of [10] | In case of [10] |
| | $Radd < 15R + 6\Delta R + \frac{\Delta R}{2}$ | $Radd > 15R + 6\Delta R + \frac{\Delta R}{2}$ |
| | In case of [11] | In case of [11] |
| | $Radd < 15R + 8\Delta R + \frac{\Delta R}{2}$ | $Radd > 15R + 8\Delta R + \frac{\Delta R}{2}$ |
| | In case of [12] | In case of [12] |
| | $Radd < 15R + 10\Delta R + \frac{\Delta R}{2}$ | $Radd > 15R + 10\Delta R + \frac{\Delta R}{2}$ |
| | In case of [13] | In case of [13] |
| | $Radd < 15R + 12\Delta R + \frac{\Delta R}{2}$ | $Radd > 15R + 12\Delta R + \frac{\Delta R}{2}$ |
| | In case of [14] | In case of [14] |
| | $Radd < 15R + 14\Delta R + \frac{\Delta R}{2}$ | $Radd > 15R + 14\Delta R + \frac{\Delta R}{2}$ |

The read operation principle of the present invention is as follows. First, the data value of an MTJ element (in this example, the MTJ element MTJ4, resistance value=8R) having the highest resistance value in the same magnetization configuration (e.g., parallel) is determined by a predetermined determination criterion.

In this example, a threshold value of $15R+7\Delta R+\Delta R/2$ is set, and the data value of the MTJ element MTJ4 can be determined by checking whether a synthetic resistance value Rtotal of the four MTJ elements MTJ1, MTJ2, MTJ3, and MTJ4 exceeds or does not exceed the threshold value.

Then, the data value of an MTJ element (in this example, the MTJ element MTJ3, resistance value=4R) having the second highest resistance value in the same magnetization configuration (e.g., parallel) is determined by a predetermined determination criterion.

This predetermined determination criterion changes in accordance with the data value of the MTJ element MTJ4.

For example, if it is determined that the data value of the MTJ element MTJ4 is "1", a threshold value of $15R+3\Delta R+\Delta R/2$ is set, and whether the synthetic resistance value Rtotal of the four MTJ elements MTJ1, MTJ2, MTJ3, and MTJ4 exceeds or does not exceed the threshold value is checked.

If it is determined that the data value of the MTJ element MTJ4 is "0", a threshold value of $15R+11\Delta R+\Delta R/2$ is set, and whether the synthetic resistance value Rtotal of the four MTJ elements MTJ1, MTJ2, MTJ3, and MTJ4 exceeds or does not exceed the threshold value is checked.

In this way, the data value of the MTJ element MTJ3 can be determined.

Subsequently, the data value of an MTJ element (in this example, the MTJ element MTJ2, resistance value=2R) having the third highest resistance value in the same magnetization configuration (e.g., parallel) is determined by a predetermined determination criterion.

This predetermined determination criterion changes in accordance with the data values of the two MTJ elements MTJ4 and MTJ3.

For example, if it is determined that the data value of the MTJ element MTJ4 is "1" and that of the MTJ element MTJ3 is "1", a threshold value of $15R+\Delta+\Delta R/2$ is set, and whether the synthetic resistance value Rtotal of the four MTJ elements MTJ1, MTJ2, MTJ3, and MTJ4 exceeds or does not exceed the threshold value is checked.

If it is determined that the data value of the MTJ element MTJ4 is "1" and that of the MTJ element MTJ3 is "0", a threshold value of $15R+5\Delta R+\Delta R/2$ is set, and whether the synthetic resistance value Rtotal of the four MTJ elements MTJ1, MTJ2, MTJ3, and MTJ4 exceeds or does not exceed the threshold value is checked.

If it is determined that the data value of the MTJ element MTJ4 is "0" and that of the MTJ element MTJ3 is "1", a threshold value of $15R+9\Delta R+\Delta R/2$ is set, and whether the synthetic resistance value Rtotal of the four MTJ elements MTJ1, MTJ2, MTJ3, and MTJ4 exceeds or does not exceed the threshold value is checked.

If it is determined that the data value of the MTJ element MTJ4 is "0" and that of the MTJ element MTJ3 is "0", a threshold value of $15R+13\Delta R+\Delta R/2$ is set, and whether the synthetic resistance value Rtotal of the four MTJ elements MTJ1, MTJ2, MTJ3, and MTJ4 exceeds or does not exceed the threshold value is checked.

In this manner, the data value of the MTJ element MTJ2 can be determined.

After that, the data value of an MTJ element (in this example, the MTJ element MTJ1, resistance value=R) having the lowest resistance value in the same magnetization configuration (e.g., parallel) is determined by a predetermined determination criterion.

This predetermined determination criterion changes in accordance with the data values of the three MTJ elements MTJ4, MTJ3, and MTJ2.

For example, if it is determined that the data value of the MTJ element MTJ4 is "1", that of the MTJ element MTJ3 is "1", and that of the MTJ element MTJ2 is "1", a threshold value of 15R+ΔR/2 is set, and whether the synthetic resistance value Rtotal of the four MTJ elements MTJ1, MTJ2, MTJ3, and MTJ4 exceeds or does not exceed the threshold value is checked.

If it is determined that the data value of the MTJ element MTJ4 is "1", that of the MTJ element MTJ3 is "1", and that of the MTJ element MTJ2 is "0", a threshold value of 15R+2ΔR+ΔR/2 is set, and whether the synthetic resistance value Rtotal of the four MTJ elements MTJ1, MTJ2, MTJ3, and MTJ4 exceeds or does not exceed the threshold value is checked.

If it is determined that the data value of the MTJ element MTJ4 is "1", that of the MTJ element MTJ3 is "0", and that of the MTJ element MTJ2 is "1", a threshold value of 15R+4ΔR+ΔR/2 is set, and whether the synthetic resistance value Rtotal of the four MTJ elements MTJ1, MTJ2, MTJ3, and MTJ4 exceeds or does not exceed the threshold value is checked.

If it is determined that the data value of the MTJ element MTJ4 is "1", that of the MTJ element MTJ3 is "0", and that of the MTJ element MTJ2 is "0", a threshold value of 15R+6ΔR+ΔR/2 is set, and whether the synthetic resistance value Rtotal of the four MTJ elements MTJ1, MTJ2, MTJ3, and MTJ4 exceeds or does not exceed the threshold value is checked.

If it is determined that the data value of the MTJ element MTJ4 is "0", that of the MTJ element MTJ3 is "1", and that of the MTJ element MTJ2 is "1", a threshold value of 15R+8ΔR+ΔR/2 is set, and whether the synthetic resistance value Rtotal of the four MTJ elements MTJ1, MTJ2, MTJ3, and MTJ4 exceeds or does not exceed the threshold value is checked.

If it is determined that the data value of the MTJ element MTJ4 is "0", that of the MTJ element MTJ3 is "1", and that of the MTJ element MTJ2 is "0", a threshold value of 15R+10ΔR+ΔR/2 is set, and whether the synthetic resistance value Rtotal of the four MTJ elements MTJ1, MTJ2, MTJ3, and MTJ4 exceeds or does not exceed the threshold value is checked.

If it is determined that the data value of the MTJ element MTJ4 is "0", that of the MTJ element MTJ3 is "0", and that of the MTJ element MTJ2 is "1", a threshold value of 15R+12ΔR+ΔR/2 is set, and whether the synthetic resistance value Rtotal of the four MTJ elements MTJ1, MTJ2, MTJ3, and MTJ4 exceeds or does not exceed the threshold value is checked.

If it is determined that the data value of the MTJ element MTJ4 is "0", that of the MTJ element MTJ3 is "0", and that of the MTJ element MTJ2 is "0", a threshold value of 15R+14ΔR+ΔR/2 is set, and whether the synthetic resistance value Rtotal of the four MTJ elements MTJ1, MTJ2, MTJ3, and MTJ4 exceeds or does not exceed the threshold value is checked.

In this manner, the data value of the MTJ element MTJ1 can be determined.

In the read operation principle of the present invention as described above, data of a plurality of MTJ elements in a read block can be read out at once by one read operation by sensing the read potential Vtotal read out to the read bit line BLj by a sense amplifier (e.g., an analog-to-digital converter).

Note that the data values of the MTJ elements MTJ1, MTJ2, MTJ3, and MTJ4 can be determined in a time-series manner, and can also be determined almost simultaneously by using a plurality of reference electric currents.

The logic shown in Tables 3 and 4 can be easily achieved by using a predetermined logic circuit. That is, when this predetermined logic circuit is used, the data values of the four MTJ elements MTJ1, MTJ2, MTJ3, and MTJ4 in a read block can be determined immediately after the read potential Vtotal is sensed.

[3-2] Read Operation Example 2

Read operation example 1 according to the embodiment of the present invention is premised on the assumption that a plurality of MTJ elements MTJ in a read block are connected in series. By contrast, practical example 2 is premised on the assumption that a plurality of MTJ elements MTJ in a read block are connected in parallel.

Even when a plurality of MTJ elements in a read block are connected in parallel, the data values of the plurality of MTJ elements can be determined by using the same principle as the read operation principle described above.

Assume that the resistance values of the MTJ elements in one block in the read operation are the same as in practical example 1.

That is, the MTJ element MTJ1 has a resistance value of R in the parallel magnetization configuration (state "1"), and a resistance value of R+ΔR in the antiparallel magnetization configuration (state "0").

The MTJ element MTJ2 has a resistance value of 2R in the parallel magnetization configuration (state "1"), and a resistance value of 2R+2ΔR in the antiparallel magnetization configuration (state "0").

The MTJ element MTJ3 has a resistance value of 4R in the parallel magnetization configuration (state "1"), and a resistance value of 4R+4ΔR in the antiparallel magnetization configuration (state "0").

The MTJ element MTJ4 has a resistance value of 8R in the parallel magnetization configuration (state "1"), and a resistance value of 8R+8ΔR in the antiparallel magnetization configuration (state "0").

As in practical example 1, the data values of the four MTJ elements MTJ1, MTJ2, MTJ3, and MTJ4 in one block have 16 combinations, so the synthetic resistance values also have 16 combinations in accordance with the 16 combinations of the data values.

Practical example 2 is premised on the assumption that a plurality of MTJ elements in a read block are connected in parallel. To simplify the explanation, therefore, the explanation will be made by using the concept "the reciprocal of a synthetic resistance value", unlike in practical example 1.

In practical example 2 as shown in Table 5 below, the reciprocals of the synthetic resistance values have a minimum value of 15/8(R+ΔR), and a maximum value of 15/8R. Also, in practical example 2, not the difference between the synthetic resistance values but the difference between the reciprocals of the synthetic resistance values is constant, unlike in practical example 1. This difference is ΔR/8R(R+ΔR).

TABLE 5

| MTJ1 | MTJ2 | MTJ3 | MTJ4 | Reciprocal of synthetic resistance value Radd |
|---|---|---|---|---|
| 1 | 1 | 1 | 1 | $15/8R = (15R + 15\Delta R)/8R(R + \Delta R)$ |
| 1 | 1 | 1 | 0 | $(15R + 14\Delta R)/8R(R + \Delta R)$ |
| 1 | 1 | 0 | 1 | $(15R + 13\Delta R)/8R(R + \Delta R)$ |
| 1 | 1 | 0 | 0 | $(15R + 12\Delta R)/8R(R + \Delta R)$ |
| 1 | 0 | 1 | 1 | $(15R + 11\Delta R)/8R(R + \Delta R)$ |
| 1 | 0 | 1 | 0 | $(15R + 10\Delta R)/8R(R + \Delta R)$ |
| 1 | 0 | 0 | 1 | $(15R + 9\Delta R)/8R(R + \Delta R)$ |
| 1 | 0 | 0 | 0 | $(15R + 8\Delta R)/8R(R + \Delta R)$ |
| 0 | 1 | 1 | 1 | $(15R + 7\Delta R)/8R(R + \Delta R)$ |
| 0 | 1 | 1 | 0 | $(15R + 6\Delta R)/8R(R + \Delta R)$ |
| 0 | 1 | 0 | 1 | $(15R + 5\Delta R)/8R(R + \Delta R)$ |
| 0 | 1 | 0 | 0 | $(15R + 4\Delta R)/8R(R + \Delta R)$ |
| 0 | 0 | 1 | 1 | $(15R + 3\Delta R)/8R(R + \Delta R)$ |
| 0 | 0 | 1 | 0 | $(15R + 2\Delta R)/8R(R + \Delta R)$ |
| 0 | 0 | 0 | 1 | $(15R + 1\Delta R)/8R(R + \Delta R)$ |
| 0 | 0 | 0 | 0 | $15/8(R + \Delta R) = 15R/8R(R + \Delta R)$ |

When a read potential (the potential difference across the MTJ element is V) is applied to the four MTJ elements MTJ1, MTJ2, MTJ3, and MTJ4 in a read block during the read operation, an electric current flowing through the read bit line BLj takes a value corresponding to the reciprocal of the synthetic resistance value of the four MTJ elements MTJ1, MTJ2, MTJ3, and MTJ4 in the read block.

Letting V be the potential difference across the MTJ element, the electric current flowing through the read bit line BLj has a minimum value of $V \times 15/8(R+\Delta R)$, and a maximum value of $V \times 15/8R$. Note that the ON resistance r of the read selection switch (MOS transistor) SWA is much lower than the synthetic resistance value of the MTJ elements MTJ1, MTJ2, MTJ3, and MTJ4.

In the read operation principle according to the present invention, when the read potential is applied to a plurality of MTJ elements in a read block during the read operation, a read current Itotal corresponding to the combination of the data values of the plurality of MTJ elements flows through the read bit line BLj. By sensing the read current Itotal by a sense amplifier (e.g., an analog-to-digital converter), therefore, the data of the plurality of MTJ elements in the read block can be read out at once by one read operation, as in practical example 1.

A practical data determination method is the reverse of that of practical example 1. First, the data value of an MTJ element (in this example, the MTJ element MTJ1, resistance value=R) having the lowest resistance value in the same magnetization configuration (e.g., parallel) is determined by a predetermined determination criterion.

Then, on the basis of the determination result, the data value of an MTJ element (in this example, the MTJ element MTJ2, resistance value=2R) having the second lowest resistance value in the same magnetization configuration (e.g., parallel) is determined by a predetermined determination criterion.

Subsequently, on the basis of the two determination results described above, the data value of an MTJ element (in this example, the MTJ element MTJ3, resistance value=4R) having the third lowest resistance value in the same magnetization configuration (e.g., parallel) is determined by a predetermined determination criterion.

Finally, on the basis of all the determination results obtained up to this point, the data value of an MTJ element (in this example, the MTJ element MTJ4, resistance value=8R) having the highest resistance value in the same magnetization configuration (e.g., parallel) is determined by a predetermined determination criterion.

In the read operation principle of the present invention as described above, data of a plurality of MTJ elements in a read block can be read out at once by one read operation by sensing the read current Itotal flowing trough the read bit line BLj by a sense amplifier (e.g., an analog-to-digital converter).

Note that the data values of the MTJ elements MTJ1, MTJ2, MTJ3, and MTJ4 can be determined in a time-series manner, and can also be determined almost simultaneously by using a plurality of reference electric currents.

[3-3] Read Circuit

A circuit example of a read circuit for achieving the read operation principle of the present invention will be explained below.

In read operation 1 described earlier, the read potential Vtotal corresponding to the synthetic resistance value of a plurality of MTJ elements in a read block appears on the read bit line BLj in the read operation.

As shown in Table 2, when the number of the MTJ elements in the read block is n (n is a plural number), the number of the synthetic resistance values is $2^n$ equivalent to the number of combinations of the data values of the MTJ elements. Accordingly, the data of the MTJ elements in the read block can be easily read out at once by detecting the read potential Vtotal appearing on the read bit line BLj by a read circuit (including a sense amplifier).

Also, in read operation 2, the read current Itotal corresponding to the synthetic resistance value of a plurality of MTJ elements in a read block flows through the read bit line BLj in the read operation.

As shown in Table 5, when the number of the MTJ elements in the read block is n (n is a plural number), the number of the reciprocals of the synthetic resistance values is $2^n$ equivalent to the number of combinations of the data values of the MTJ elements. Therefore, the data of the MTJ elements in the read block can be easily read out at once by detecting the read current Itotal flowing through the read bit line BLj by a read circuit (including a sense amplifier).

Figure 7:
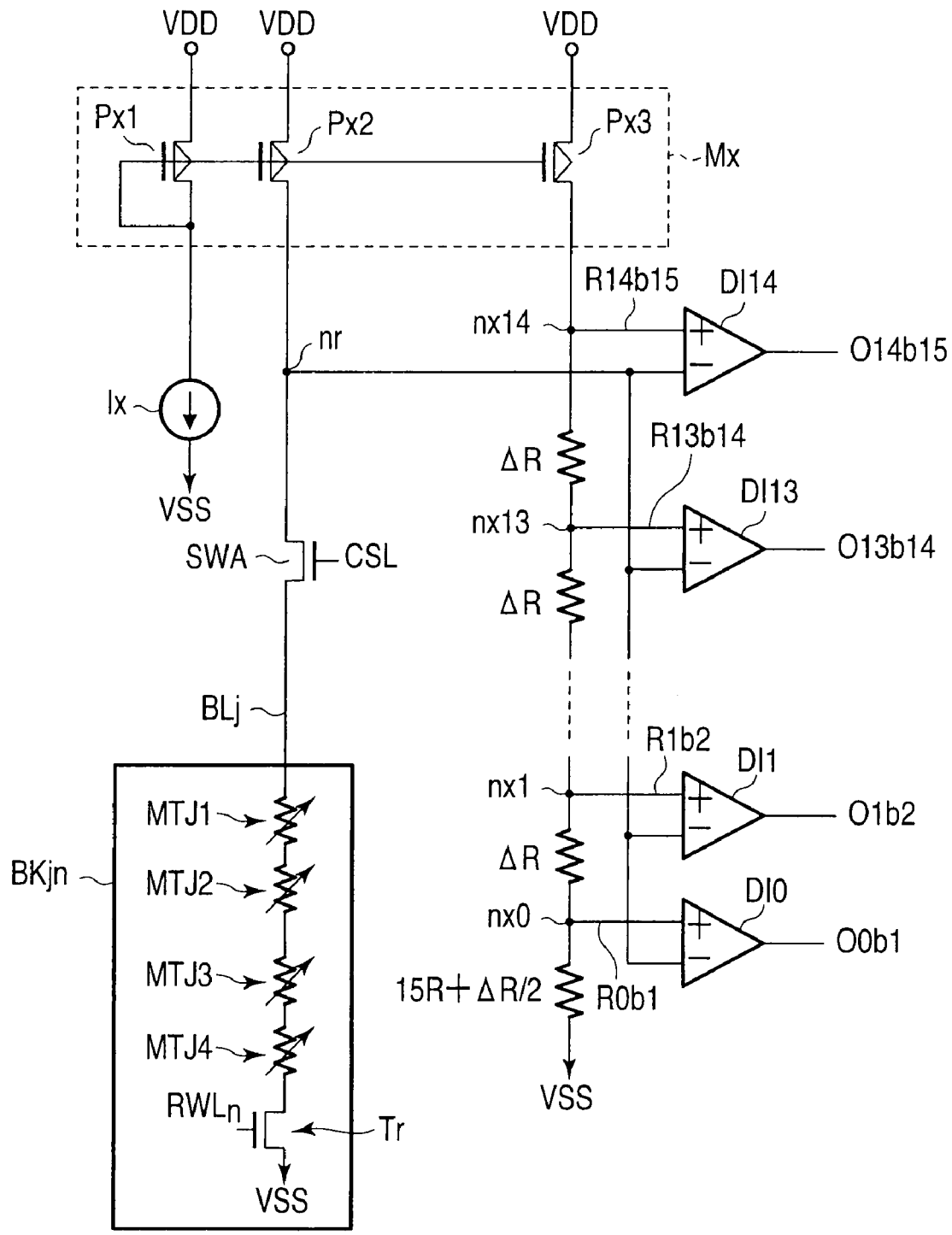
FIG. 7 is an equivalent circuit diagram of a read circuit according to the embodiment of the present invention.

FIG. 7 is an equivalent circuit diagram of the read circuit according to the embodiment of the present invention. An example of the read circuit according to this embodiment will be explained below. Note that the number of MTJ elements in one block is four in this example, but the number of the MTJ elements is changeable.

As shown in FIG. 7, the read circuit according to this embodiment includes an analog-to-digital converter (A/D converter) as a sense amplifier.

One terminal of a block BKjn including four series-connected MTJ elements MTJ1, MTJ2, MTJ3, and MTJ4 is connected to a power supply terminal VDD via an N-channel MOS transistor SWA and P-channel MOS transistor Px2, and the other terminal of the block BKjn is connected to a ground terminal VSS. The connection of the four MTJ elements MTJ1, MTJ2, MTJ3, and MTJ4 in the block BKjn may also be a parallel connection instead of the series connection. Note that a first current path extends from the power supply terminal VDD to the ground terminal VSS via the MOS transistors Px2 and SWA and the plurality of MTJ elements MTJ1, MTJ2, MTJ3, and MTJ4.

One end of a plurality of (e.g., 14) resistance elements having a resistance value $\Delta R$ is connected to the power supply terminal VDD via a P-channel MOS transistor Px3. The other end of the plurality of resistance elements is connected to the ground terminal VSS via a resistance element having a resistance value of $15R+\Delta R/2$. Note that a second current path extends from the power supply terminal VDD to the ground terminal VSS via the MOS transistor Px3 and the plurality of resistance elements.

Note that R and ΔR have the same meanings as those of R and ΔR explained in the section of the read operation principle.

A P-channel MOS transistor Px1 and the P-channel MOS transistors Px2 and Px3 form a current mirror circuit Mx. Accordingly, a constant current generated by a constant current source Ix flows through the first and second current paths described above.

The electric current flowing through the first current path functions as a read current, and this read current flows through the plurality of MTJ elements. Consequently, a read potential Vtotal corresponding to the data value (synthetic resistance value) of the MTJ elements in the block BKjn appears at a node nr. On the other hand, when the electric current flows through the second current path, predetermined reference potentials appear at connection points nx0, nx1, . . . , nx13, and nx14 of the resistance elements.

Differential amplifiers DI0, DI2, . . . , DI13, and DI14 compare the read potential Vtotal at the node nr with the predetermined reference potentials, and output the comparison results as output signals O0b1, O1b2, . . . , O13b14, and O14b15.

For example, the reference potential at the node nx0 is input to the positive input terminal of the differential amplifier DI0, and the read potential Vtotal at the node nr is input to the negative input terminal of the differential amplifier DI0. Likewise, the reference potential at the node nx1 is input to the positive input terminal of the differential amplifier DI1, and the read potential Vtotal at the node nr is input to the negative input terminal of the differential amplifier DI1. Analogously, the reference potential at the node nx14 is input to the positive input terminal of the differential amplifier DI14, and the read potential Vtotal at the node nr is input to the negative input terminal of the differential amplifier DI14.

[4] Structure of MTJ Element

A plurality of series-connected MTJ elements in this example have different resistance values and reversal current amounts in the same resistance state. MTJ elements like these can be implemented by structure examples 1 and 2 below.

[4-1] Structure Example 1

The structure of an element group 10 including three MTJ elements according to structure example 1 of this embodiment will be explained below.

Figure 8:
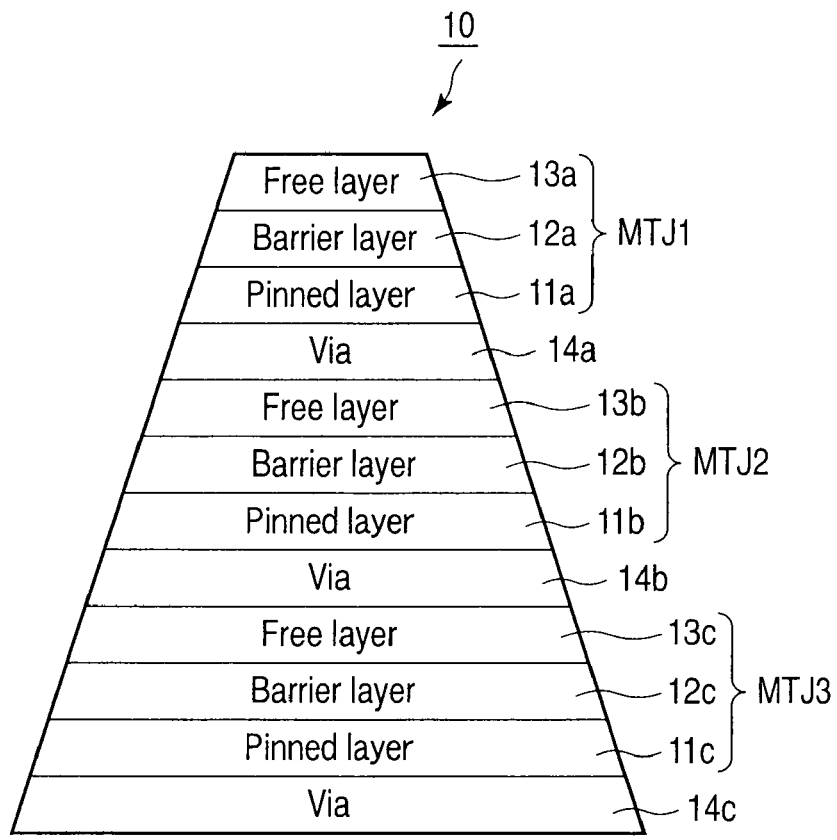
FIG. 8 is a sectional view showing structure example 1 of an MTJ element group according to the embodiment of the present invention.

As shown in FIG. 8, three MTJ elements MTJ3, MTJ2, and MTJ1 are stacked in this order on a substrate (not shown), and the sectional structure has a tapered shape as a whole. Accordingly, tunnel barrier junction areas S1, S2, and S3 of the MTJ elements MTJ1, MTJ2, and MTJ3 are different and satisfy condition S1<S2<S3.

The MTJ elements MTJ1, MTJ2, and MTJ3 respectively include pinned layers 11a, 11b, and 11c in which the magnetization is fixed, free layers 13a, 13b, and 13c in which the magnetization is reversible, and barrier layers 12a, 12b, and 12c sandwiched between the pinned layers 11a, 11b, and 11c and free layers 13a, 13b, and 13c. A via 14c is formed below the MTJ element MTJ3, a via 14b is formed between the MTJ elements MTJ2 and MTJ3, and a via 14a is formed between the MTJ elements MTJ1 and MTJ2. The vias 14a, 14b, and 14c connect the MTJ elements MTJ1, MTJ2, and MTJ3 in series.

The element group 10 having structure example 1 is formed as follows. First, element films 11a, 11b, 11c, 12a, 12b, 12c, 13a, 13b, and 13c for forming the MTJ elements MTJ1, MTJ2, and MTJ3 and vias 14a, 14b, and 14c are stacked in the form of a pillar. Then, the pillar is processed into a tapered shape by taper etching or ion milling. In this manner, structure example 1 can be simply implemented without using a plurality of masks.

[4-2] Structure Example 2

The structure of an element group 10 including two MTJ elements according to structure example 2 of this embodiment will be explained below with reference to FIG. 9.

Figure 9:
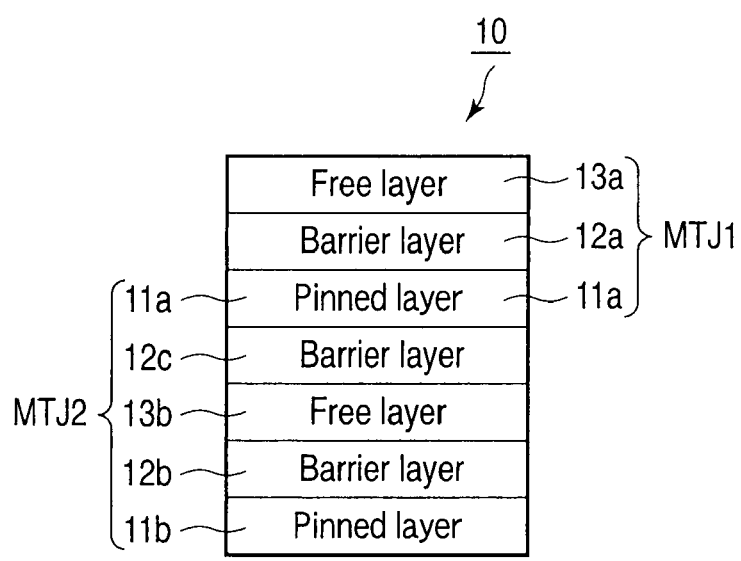
FIG. 9 is a sectional view showing structure example 2 of the MTJ element group according to the embodiment of the present invention.

As shown in FIG. 9, a free layer 13a of an MTJ element MTJ1 is adjacent to only a pinned layer 11a, but a free layer 13b of an MTJ element MTJ2 is sandwiched between the pinned layer 11a and a pinned layer 11b. That is, the MTJ element MTJ1 has a single-junction structure, and the MTJ element MTJ2 has a double-junction structure.

The resistance value of an MTJ element rises as the number of barrier layers increases, and the necessary reversal electric current decreases as the number of adjacent pinned layers increases. Accordingly, R1<R2 and Ic1>Ic2 can be achieved. This makes it possible to individually perform write and read operations on the two MTJ elements MTJ1 and MTJ2. In addition, the structure of structure example 2 can be fabricated more easily than that of structure example 1 because there is no new element in structure example 2.

[4-3] Structure Example 3

In structure example 3 of this embodiment, to individually generate reversal electric currents of MTJ elements, it is possible to change, e.g., the compositions or volumes of free layers or the volumes or film thicknesses of barrier layers of the individual MTJ elements.

[5] Effects

In the embodiment of the present invention, a memory cell includes a transistor and, e.g., three MTJ elements (1 Tr+3 MTJ). Since n bits can be stored in a memory cell having only one transistor, the cell area per bit can be reduced. The cell area per bit can be further reduced by stacking a plurality of MTJ elements on a substrate. In the present invention as described above, a low-cost, large-capacity spin transfer torque writing type MRAM can be implemented because the cell area per bit can be reduced.

Note that when the number of MTJ elements is larger than three, the memory operates with no problem by the same configuration and operation as described above, and the cell area per bit can be further decreased.

[6] Application Examples

In the above embodiment, a magnetic random access memory using a magnetoresistive element (resistance change element) has been explained as an example of a semiconductor memory device. However, the present invention is not limited to this, and can be applied to, e.g., the following semiconductor memory devices.

First, the present invention is applicable to a PRAM (Phase-change Random Access Memory) using a chalcogenide element (resistance change element). The PRAM controls the resistance value of the chalcogenide element by changing the phase to a crystalline state or amorphous state by controlling the process from heating to cooling in accordance with the magnitude and the shape such as the width of a current/voltage pulse to be applied to the chalcogenide element.

The present invention is also applicable to an ReRAM (Resistance Random Access Memory) using a transition metal oxide element (resistance change element). When the ReRAM is a bipolar device, the ReRAM controls the resistance value of the transition metal oxide element in accordance with the direction of a current/voltage pulse to be applied to the element. When the ReRAM is a unipolar device, the ReRAM controls the resistance value of the transition metal oxide element in accordance with the magnitude and the shape such as the width of the current/voltage pulse to be applied to the element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   n resistance change elements which are arranged in one cell, have a low-resistance state and a high resistance state, are connected in series or parallel, have different resistance values in the same resistance state, and change between the low-resistance state and the high-resistance state under different conditions; and
   a write circuit which is connected to one end of the n resistance change elements, and applies a pulse current m ($1 \leq m \leq n$) times to the n resistance change elements during a write operation,
   wherein letting Im be a current value of an mth pulse current, condition $I1>I2> \ldots >Im$ holds.

2. The device according to claim 1, wherein letting tm be a pulse width of the mth pulse current, condition $t1=t2= \ldots =tm$ holds.

3. The device according to claim 1, wherein
   the resistance change element is a magnetoresistive effect element,
   the semiconductor memory device is a spin transfer torque writing type magnetic random access memory, and
   information is written in order from the magnetoresistive effect element having a largest reversal current amount which changes between the low-resistance state and the high-resistance state.

4. The device according to claim 3, wherein
   the n magnetoresistive effect elements are stacked on a substrate,
   a sectional structure of the n magnetoresistive effect elements has a tapered shape as a whole, and
   areas of tunnel barrier junctions of the n magnetoresistive effect elements are different.

5. The device according to claim 3, wherein if the n magnetoresistive effect elements are two magnetoresistive effect elements, one magnetoresistive effect element has a single-junction structure, and the other magnetoresistive effect element has a double-junction structure.

6. The device according to claim 3, wherein the n magnetoresistive effect elements are different in one of a composition and volume of a free layer and a volume and film thickness of a barrier layer.

7. The device according to claim 1, which further comprises a transistor having a current path whose one end is connected to the other end of the n resistance change elements, and
   in which the n resistance change elements are arranged in order such that a resistance change element having a highest resistance in the same resistance state is positioned closest to one end of the current path of the transistor.

8. A semiconductor memory device comprising:
   n resistance change elements which are arranged in one cell, have a low-resistance state and a high resistance state, are connected in series or parallel, have different resistance values in the same resistance state, and changes between the low-resistance state and the high-resistance state under different conditions; and
   a write circuit which is connected to one end of the n resistance change elements, and applies a pulse current m ($1 \leq m \leq n$) times to the n resistance change elements during a write operation,
   wherein letting tm be a pulse width of an mth pulse current, condition $t1>t2> \ldots >tm$ holds.

9. The device according to claim 8, wherein letting Im be a current value of the mth pulse current, condition $I1=I2= \ldots =Im$ holds.

10. The device according to claim 8, wherein
    the resistance change element is a magnetoresistive effect element,
    the semiconductor memory device is a spin transfer torque writing type magnetic random access memory, and information is written in order from the magnetoresistive effect element having a largest pulse width which changes between the low-resistance state and the high-resistance state.

11. The device according to claim 10, wherein
    the n magnetoresistive effect elements are stacked on a substrate,
    a sectional structure of the n magnetoresistive effect elements has a tapered shape as a whole, and
    areas of tunnel barrier junctions of the n magnetoresistive effect elements are different.

12. The device according to claim 10, wherein if the n magnetoresistive effect elements are two magnetoresistive effect elements, one magnetoresistive effect element has a single-junction structure, and the other magnetoresistive effect element has a double-junction structure.

13. The device according to claim 10, wherein the n magnetoresistive effect elements are different in one of a composition and volume of a free layer and a volume and film thickness of a barrier layer.

14. The device according to claim 8, which further comprises a transistor having a current path whose one end is connected to the other end of the n resistance change elements, and
    in which the n resistance change elements are arranged in order such that a resistance change element having a highest resistance in the same resistance state is positioned closest to one end of the current path of the transistor.

* * * * *